United States Patent
Cho et al.

(10) Patent No.: US 6,214,663 B1
(45) Date of Patent: Apr. 10, 2001

(54) METHODS OF FABRICATING INTEGRATED CIRCUIT DEVICES HAVING CONTACT PADS WHICH ARE SEPARATED BY SIDEWALL SPACERS

(75) Inventors: Sang-yeon Cho; Jae-kwan Park, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/160,781

(22) Filed: Sep. 24, 1998

Related U.S. Application Data

(62) Division of application No. 08/667,009, filed on Jun. 20, 1996, now Pat. No. 5,866,927.

(30) Foreign Application Priority Data

Jun. 20, 1995 (KR) .................................................. 95-16460

(51) Int. Cl.[7] ................. H01L 21/8242; H01L 21/8234; H01L 21/20
(52) U.S. Cl. ........................ 438/253; 438/238; 438/254; 438/396
(58) Field of Search .................................... 438/238, 253, 438/634, 652, 657, 671, 684, 197, 199, 396

(56) References Cited

U.S. PATENT DOCUMENTS

| | | | |
|---|---|---|---|
| 5,066,606 | * 11/1991 | Lee ........................................ | 438/253 |
| 5,225,699 | * 7/1993 | Nakamura ............................. | 257/306 |
| 5,248,628 | * 9/1993 | Okabe et al. .......................... | 438/256 |
| 5,285,088 | * 2/1994 | Sato et al. ............................. | 257/192 |
| 5,296,400 | * 3/1994 | Park et al. ............................. | 438/253 |
| 5,374,576 | * 12/1994 | Kimura et al. ........................ | 438/253 |
| 5,476,807 | * 12/1995 | Lee et al. .............................. | 438/396 |
| 5,478,772 | * 12/1995 | Fazan .................................... | 438/396 |
| 5,486,712 | 1/1996 | Arima .................................... | 257/296 |
| 5,545,579 | * 8/1996 | Liang et al. ........................... | 438/291 |
| 5,569,948 | * 10/1996 | Kim ....................................... | 257/382 |
| 5,663,092 | * 9/1997 | Lee ........................................ | 438/253 |
| 6,001,685 | * 12/1999 | Kim ....................................... | 438/253 |

\* cited by examiner

*Primary Examiner*—Trung Dang
*Assistant Examiner*—Brook Kebede
(74) *Attorney, Agent, or Firm*—Myers Bigel Sibley & Sajovec

(57) ABSTRACT

An integrated circuit field effect transistor includes contact pads which are separated by sidewall spacers. A first pad which electrically contacts one of the spaced-apart source and drain regions extends onto the gate electrode top, to define a first pad sidewall on the gate electrode top. A first capping layer on the first pad defines a first capping layer sidewall on the first pad. A first insulating sidewall spacer is formed on the first pad sidewall and on the first capping layer sidewall. A second pad, electrically contacting the other of the source and drain regions, extends onto the gate electrode top and contacts the first insulating sidewall spacer. A second capping layer may be formed on the second pad, opposite the substrate, to define a second capping layer sidewall on the first capping layer. A second insulating sidewall spacer may be formed on the second pad sidewall and on the second capping layer sidewall. Apertures may be formed in the capping layer and in the second capping layer to expose the first pad and the second pad, respectively. A storage capacitor may be electrically connected to the first pad and a bit line may be electrically connected to the second pad. By forming the first and second pads of separate layers in separate steps, and by separating the pads by an insulating sidewall spacer, process margins can be increased and reliability and yield can be increased.

10 Claims, 16 Drawing Sheets

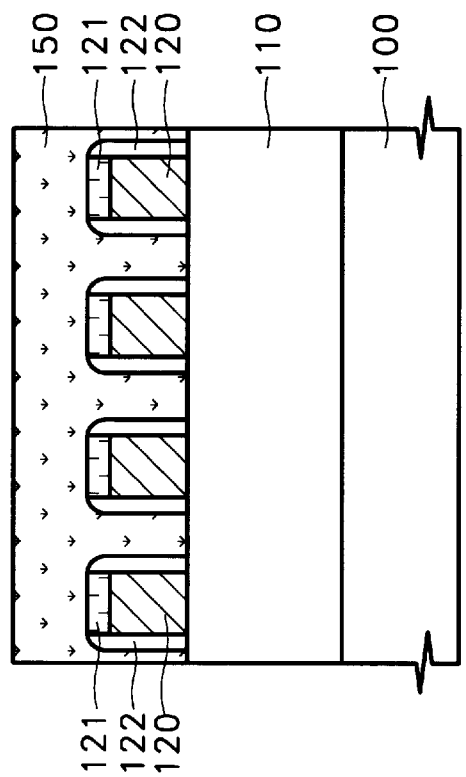
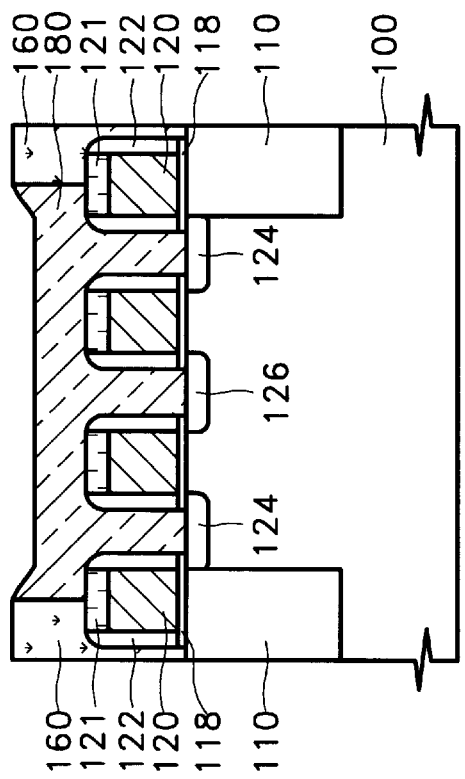

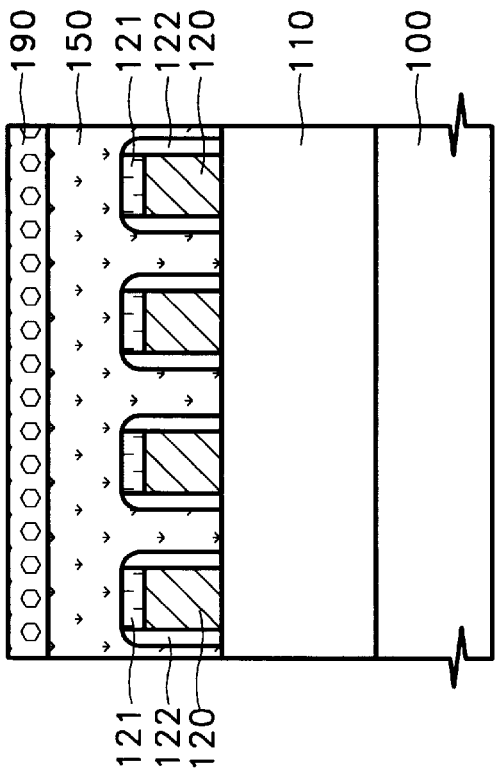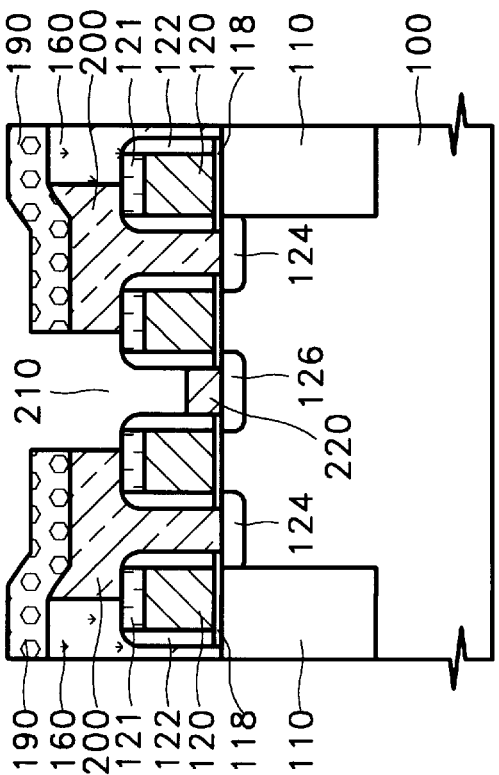

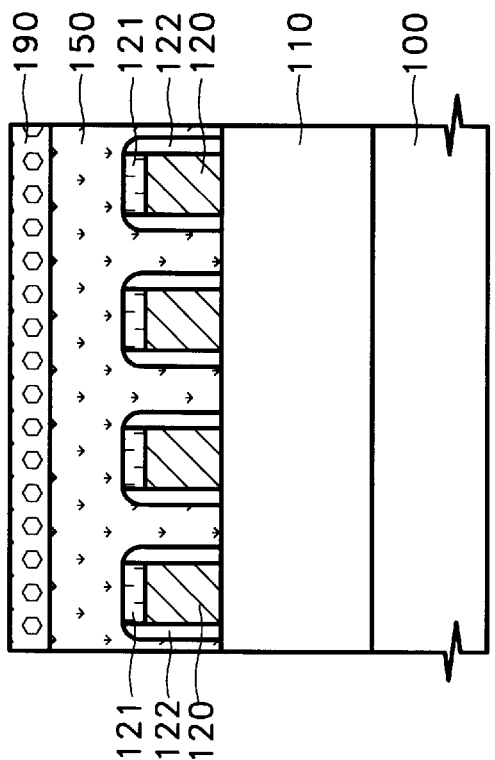
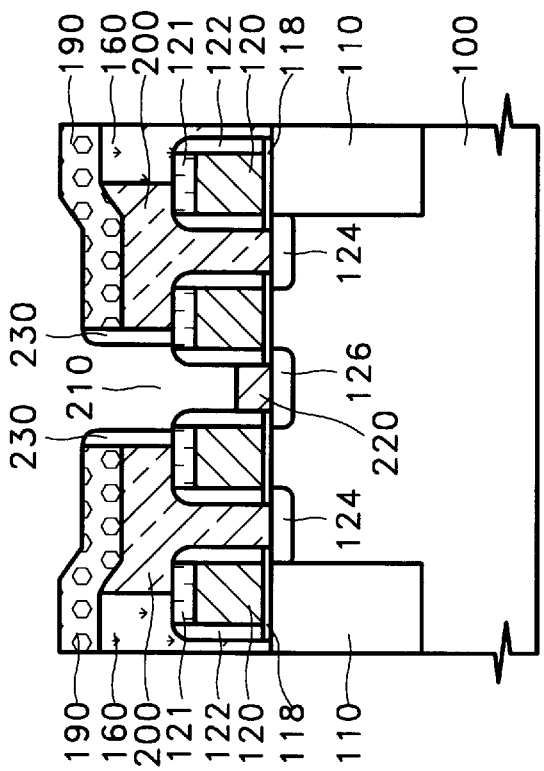

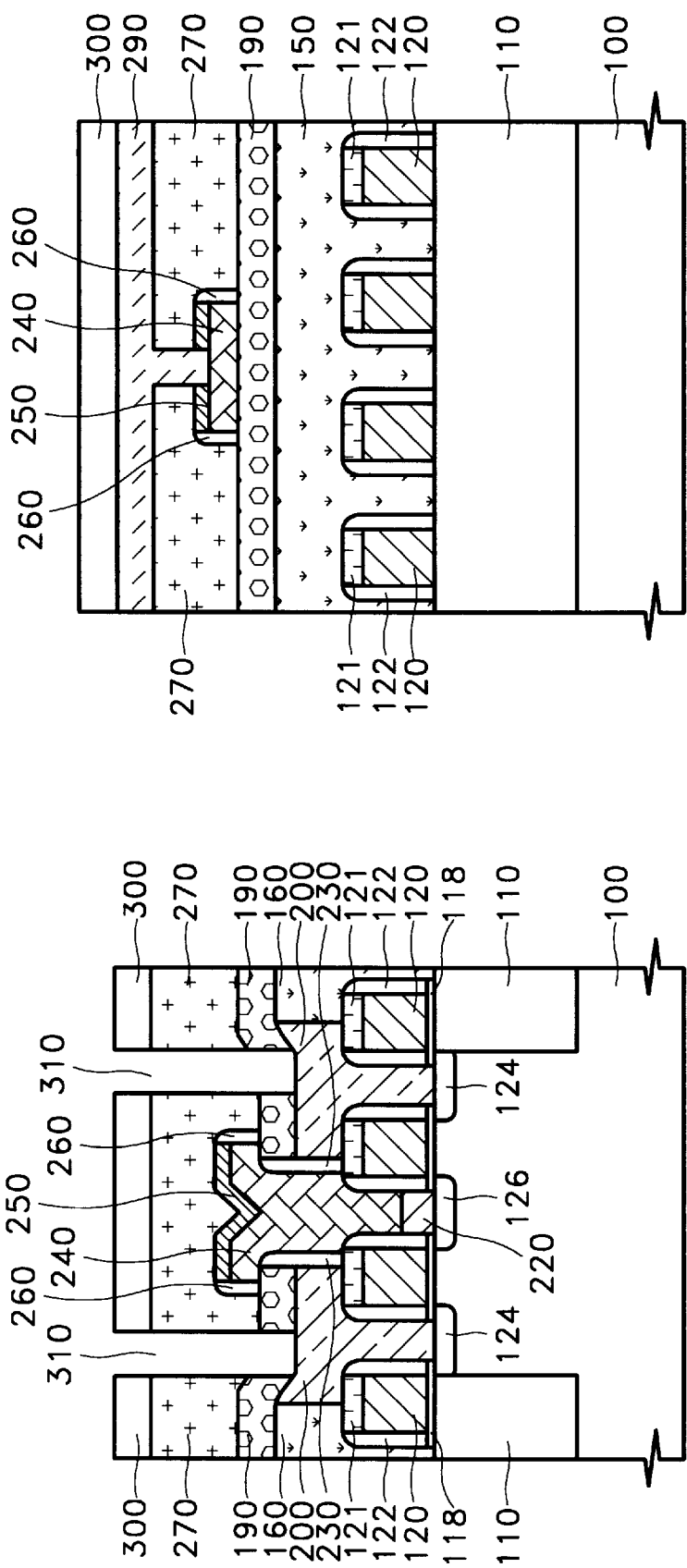

METHODS OF FABRICATING INTEGRATED CIRCUIT DEVICES HAVING CONTACT PADS WHICH ARE SEPARATED BY SIDEWALL SPACERS

This application is a divisional application of U.S. patent application Ser. No. 08/667,009, filed Jun. 20, 1996 now U.S. Pat. No. 5,866,927.

FIELD OF THE INVENTION

This invention relates to integrated circuit devices and methods of fabricating same, and more particularly to contact pads for integrated circuit devices and methods of fabricating same.

BACKGROUND OF THE INVENTION

Integrated circuits are widely used for microprocessor, memory and logic devices in consumer, industrial and military electronics. As the integration density of integrated circuit devices continues to increase, it becomes increasingly difficult to make contacts to the devices, such as transistors, in the integrated circuit.

In particular, in integrated circuit fabrication, an increase in device integration density generally causes a reduction in the integrated circuit ground rules and a narrowing of process margins. Accordingly, it is desirable to form contacts which connect devices in the integrated circuit to one another, having minimum feature sizes. Moreover, even when a contact is formed using minimum feature size, it must also be ensured that the contact does not inadvertently contact unintended layers due to misalignment of an etch mask during formation of the contact. For example, in a memory device, a gate electrode may inadvertently contact a bit line electrode, a bit line electrode may inadvertently contact a storage electrode or a gate electrode may inadvertently contact a storage electrode. Any of these inadvertent contacts may render a memory device inoperable and will thereby lower the yield of the fabrication process.

In view of the above, various techniques have been developed for miniaturizing a contact while minimizing the risk of inadvertent contact to another layer as a result of misalignment of an etch mask or other factors. One such technique is self-aligned contact formation. Self-aligned contact formation may be used to form contacts of reduced sizes without the need for a separate mask.

Referring now to FIGS. 1–3, a fabrication method of a conventional semiconductor device using self-aligned contacts will be described. FIG. 1 is a top view of a conventional layout for manufacturing a semiconductor device having two contact pads. In particular, the layout of FIG. 1 may be used to manufacture a Dynamic Random Access Memory (DRAM) device. Reference numeral P1 indicates a first mask pattern which is used to manufacture field oxide regions in an inactive region of a semiconductor substrate. Reference numeral P2 indicates a second mask pattern which is used to form a gate electrode. Reference numeral P3 indicates a third mask pattern which is used to form a bit line pad. Reference numeral P4 indicates a fourth mask pattern which is used to form a storage pad. Reference numeral P5 indicates a fifth mask pattern which is used to connect a bit line pad to the bit line, and reference numeral P6 indicates a sixth mask pattern which forms a fourth contact hole to connect the storage pad to a storage electrode. Finally, reference numeral R1 indicates a contact region between the storage electrode and the source, and reference numeral R2 indicates a contact region between the bit line and the drain.

FIGS. 2A and 2B are cross-sectional views which illustrate a semiconductor device having a pair of contact pads taken along line II–II' of FIG. 1, during intermediate fabrication steps. As shown in FIG. 2A, a field oxide film 12 is formed in a semiconductor substrate to define inactive regions thereof, using the first mask pattern P1. A gate oxide film 14 is then formed on the semiconductor substrate 10. A polysilicon layer and an insulating film are deposited on the gate oxide film 14, and patterned, to thereby form a gate electrode 16 which is insulated by an insulating film 18. This patterning process is performed using mask pattern P2 of FIG. 1.

An oxide film is then deposited on the resultant structure, including on the gate electrode 16. The oxide film is anisoptropically etched to thereby form spacers 20 on the sidewalls of the gate electrode 16 and on the insulating film 18. Dopants are then implanted into the surface of the substrate to thereby form a source region 22 and a drain region 24. It will be understood that during the anisotropic etching described above for forming the spacer 20, a portion of the gate oxide film in the regions where the source and drains are to be formed, is also partially etched. This etching forms first and second contact holes 15 and 17, to expose a portion of the substrate where the source and drain regions are to be formed. The source region is formed at region R1 of FIG. 1, and the drain is formed at region R2 of FIG. 1.

Still referring to FIG. 2A, a doped polysilicon layer is formed on the resultant structure, including on self-aligned contact holes 15 and 17. The polysilicon layer is then etched using the third and fourth mask patterns P3 and P4 of FIG. 1, to thereby form a storage pad 26 which is electrically connected to the source 22 through the first contact hole 15, and a bit line pad 28 which is connected to the drain region 24 through the second contact hole 17.

Referring now to FIG. 2B, an insulating material such as borophosphorsilicate-glass (BPSG) is deposited and then reflowed at a high temperature to thereby form a planarized layer 30. The planarized layer 30 is anisotropically etched using the fifth mask pattern P5 of FIG. 1, to thereby form a third contact hole 32, also referred to as a bit line contact hole. A bit line 34 is then connected to the bit line pad 28 through the third contact hole 32. Another insulating layer is then formed on the substrate and a fourth contact hole, referred to as a storage electrode contact hole (not shown) is formed to Connect the storage pad 26 to a storage electrode (also not shown). The storage electrode is then formed using the sixth mask pattern P6 of FIG. 1.

Still referring to FIGS. 2A and 2B, in order to separate the storage pad 26 and the bit line pad 28 from each other, a separation space between the pads is formed by etching the polysilicon layer, as described above. The space is then filled with insulating material such as the planarization layer 30. Unfortunately, as the integration density continues to increase and the separation between the storage pad and bit line pad continues to decrease, it becomes increasingly difficult to maintain the separation between the pads. This separation distance is denoted by L1 in FIG. 1.

Attempts have been made to maintain the separation between the pads notwithstanding their shrinking dimensions, by using lower wavelengths of light in the photolithography process. However, due to mask alignment tolerances, it still generally becomes necessary to maintain a minimum separation distance between the pads, thus precluding more dense integration.

Moreover, during fabrication of the pads, a conductive polysilicon bridge may form between the pads due to their small separation, thereby degrading the device yield and reliability. Finally, the pads are generally formed in an active region of a semiconductor device. The storage electrode contact holes and the bit line contact hole are also located within the active region as shown in P5 and P6 of FIG. 1. Since the distance L2 of FIG. 1 between the storage electrode contact holes or the distance L3 of FIG. 1 between a storage electrode contact hole and the bit line contact hole decrease as integration density increases, the process margins also decrease.

In view of the above, it has become exceedingly difficult to fabricate closely spaced pads of small dimensions while maintaining adequate pad separation, to produce functional and reliable devices with acceptable fabrication yields.

SUMMARY OF THE INVENTION

It is therefore an object of the present invention to provide integrated circuits having contact pads which can be closely spaced, yet insulated from one another, and methods of fabricating same.

It is another object of the present invention to provide integrated circuit field effect transistors and memory devices having pads which can be closely spaced yet insulated from one another, and methods of fabricating same.

These and other objects are provided, according to the present invention, by an integrated circuit including a first insulating sidewall spacer on a first pad sidewall which electrically insulates the first pad sidewall from a second pad sidewall of a second pad. Closely spaced contact pads may thereby be formed for an integrated circuit device, with reduced risk of shorting or bridging of pads, notwithstanding shrinking dimensions and required process margins of the fabrication process.

An integrated circuit field effect transistor, according to the present invention, includes spaced-apart source and drain regions in a semiconductor substrate and a gate electrode on the semiconductor substrate, between the spaced-apart source and drain regions. A first pad electrically contacts one of the spaced-apart source and drain region and extends onto the top of the gate electrode, to define a first pad sidewall on the gate electrode top. The integrated circuit field effect transistor also includes a first capping layer on the first pad, opposite the gate electrode top, to define a first capping layer sidewall on the first pad. A first insulating sidewall spacer is included on the first pad sidewall and on the first capping layer sidewall. A second pad electrically contacts the other of the spaced-apart source and drain regions, extends onto the gate electrode top and contacts the first insulating sidewall spacer.

In a preferred embodiment, the second pad extends onto the first capping layer to define a second pad sidewall. A second capping layer is also included on the second pad, to define a second capping layer sidewall on the first capping layer. A second insulating sidewall spacer is located on the second pad sidewall and on the second capping layer sidewall. Thus, the second pad may be closely spaced to the first pad but is still insulated therefrom using the first and second insulating sidewall spacers.

The above-described integrated circuit field effect transistor may form an integrated circuit memory device, wherein the first pad is a storage node pad which electrically con tacts the source region and electrically connects the source region to a storage capacitor. The second pad is a bit line pad which connects the drain region to a bit line. The first and second pads, which are separated from one another by a sidewall spacer, may also be used to form integrated circuit contact structures for other integrated circuit devices, where the gate electrode may be a mesa on the substrate.

Integrated circuit field effect transistors may be fabricated, according to the invention, by forming spaced-apart source and drain regions in a semiconductor substrate and a gate electrode on the semiconductor substrate between the spaced-apart source and drain regions. A first pad is formed, which electrically connects with one of the spaced-apart source and drain regions, and which extends onto the gate electrode top to define a first pad sidewall on the gate electrode top. A first capping layer is formed on the first pad opposite the gate electrode top to define a first capping layer sidewall on the first pad. A first insulating sidewall spacer is formed on the first pad sidewall and on the first capping layer sidewall. A second pad, electrically contacting the other of the spaced-apart source and drain regions is formed, extending onto the gate electrode top and contacting the first insulating sidewall spacer.

A second capping layer may be formed on the second pad to define a second capping layer sidewall on the second pad, and a second insulating sidewall spacer may be formed on the second pad sidewall and on the second capping layer sidewall. An aperture is formed in the second capping layer to expose the second pad, and an aperture is formed in the capping layer to expose the first pad. In a memory device, storage capacitor is electrically connected to the first pad through the aperture in the capping layer and a bit line is electrically connected to the second pad through the aperture in the second capping layer.

More specifically, an integrated circuit field effect transistor may be formed by forming a first conductive layer on a semiconductor substrate including on the gate electrode. A first capping layer is formed on the first conductive layer. The first capping layer and the first conductive layer are patterned to form a first pad, electrically contacting one of the spaced-apart source and drain regions and having the first capping layer thereon. The patterning step defines a first pad sidewall and a first capping layer sidewall. A first sidewall spacer is formed on the first pad sidewall and on the first capping layer sidewall. A second conductive layer is formed on the semiconductor substrate including on the first sidewall spacer. The second conductive layer iis patterned to form a second pad, electrically contacting the other of the spaced-apart source and drain regions, and insulated from the first pad by the first sidewall spacer.

The first conductive layer may be formed by forming a planarized insulating layer on the semiconductor substrate, including on the gate, and by removing the planarized insulating layer from on the source and drain regions and from on the gate. A first conductive layer is formed on the source and drain regions, on the gate and on the planarized insulating layer. The first conductive layer is then etched to expose the planarized insulating layer. The first conductive layer is preferably etched to below the top of the gate electrode adjacent the other of the spaced-apart source and drain regions.

The step of forming a second conductive layer on the semiconductor substrate may be followed by the step of forming a second capping layer on the second conductive layer. Then, the second conductive layer and the second capping layer are patterned to form the second pad which electrically contacts the other of the spaced-apart source and drain regions, and having a second capping layer thereon.

The step of patterning the second conductive layer may be followed by the step of forming a first interlayer insulating layer on the semiconductor substrate including on the second pad. The first interlayer insulating layer is then etched over the second pad to thereby form a first contact hole to partially expose the second pad. A third conductive layer is formed which electrically contacts the second pad through the first contact hole. A second interlayer may then be formed on the semiconductor substrate including on the third conductive layer, and the first and second interlayer insulating layers may be etched over the first pad to thereby form a second contact hole to partially expose the first pad. The third conductive layer may be patterned to form a bit line which is connected to the second pad through the first contact hole. A storage electrode of a capacitor may be formed on the second interlayer insulating layer, which electrically contacts the first pad through the second contact hole.

Accordingly, the first and second contact pads are formed using separate first and second layers in separate first and second processing steps, and are separated from one another by insulated sidewall spacers. High density contact structures may thus be reliably fabricated for high density integrated circuits.

BRIEF DESCRIPTION OF THE DRAWINGS

FIGS. 5A through 5L are cross-sectional views of a semiconductor device having multiple contact pads according to the present invention, taken along line I–I' of FIG. 3, during intermediate fabrication steps.

FIGS. 6A through 6L are cross-sectional views of a semiconductor device having multiple contact pads according to the present invention, taken along line 2–2' of FIG. 3, during intermediate fabrication steps.

DETAILED DESCRIPTION OF PREFERRED EMBODIMENTS

Figure 1:
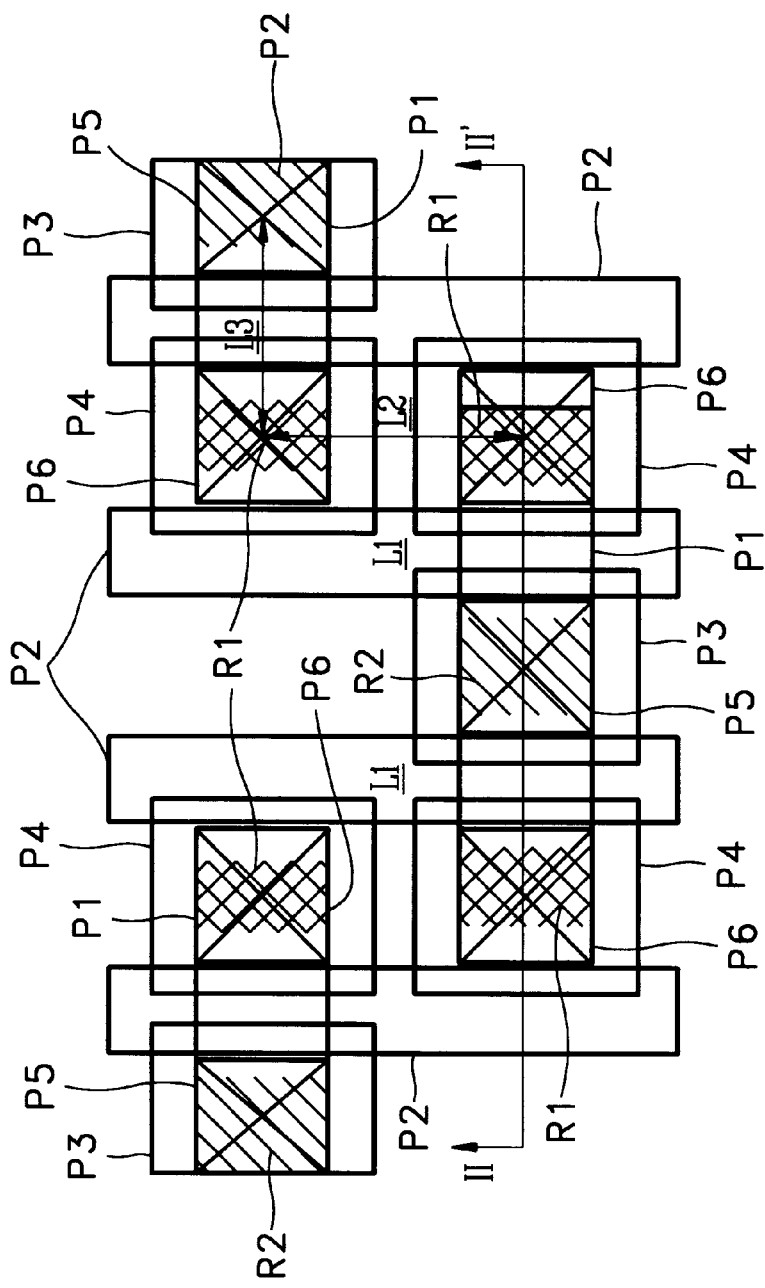
FIG. 1 is a top view of a conventional layout for fabricating a semiconductor device having multiple contact pads.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
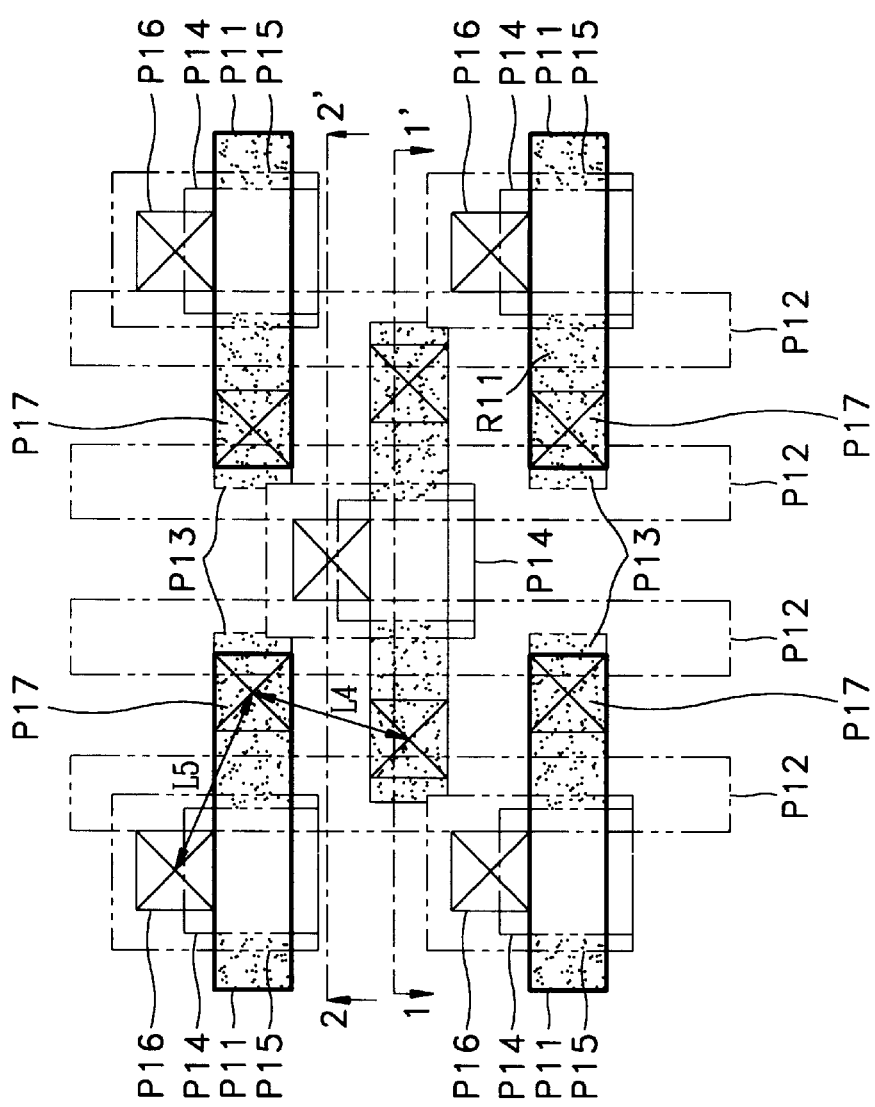
FIG. 3 is a top view of a layout for fabricating a semiconductor device having multiple contact pads according to the present invention.

Referring now to FIG. 3, reference numeral P11 indicates a first mask pattern for fabricating an isolation film in an inactive region of a semiconductor substrate. Reference numeral P12 indicates a second mask pattern for forming a gate electrode. Reference numeral P13 indicates a third mask pattern for forming a storage pad. Reference numeral P14 indicates a fourth mask pattern for forming a contact hole for connecting a bit line pad to a drain. Reference numeral P15 indicates a fifth mask pattern for forming the bit line pad. Reference numeral P16 indicates a sixth mask pattern for forming a contact hole for connecting a bit line to the bit line pad, and reference numeral P17 indicates a seventh mask pattern for forming a contact hole for connecting a storage electrode to the storage pad. Also, reference numeral R11 is a dotted rectangle which indicates a storage pad formation region.

Still referring to FIG. 3, the first mask pattern P11, represented by a thick solid line, forms a horizontally extending rectangle, which is arranged over the cell array region in a matrix. The second mask pattern P12, represented by a triple-dashed line, forms a vertically extending rectangle, which is arranged over the cell array region in a rail. The third mask pattern P13, represented by a dotted line, extends vertically the same length as the first mask pattern P11, and extends horizontally longer than the first mask pattern P11.

The fourth mask pattern P14, represented by a single-dashed line, is arranged over the cell array region in a matrix, and partially overlaps the third mask pattern P13. The fifth mask pattern P15, represented by a double-dashed line, forms a vertically extending rectangle and includes the fourth mask pattern P14 therein. The sixth mask pattern P16 is represented by a square, in which two oblique lines are drawn. The seventh mask pattern P17 is represented by a square, in which two oblique lines are drawn, and is arranged to overlap with a horizontal side of the first mask pattern P11. It will be understood that the mask patterns of FIG. 3 are arranged according to an embodiment of the invention, and can be modified without departing from the scope of the present invention.

Figure 4B:
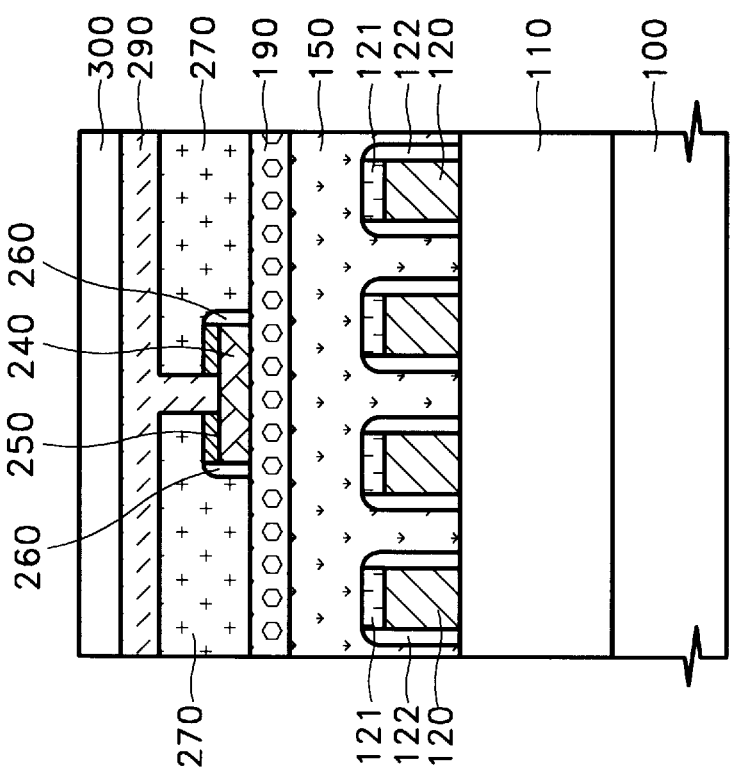
FIGS. 4A and 4B are cross-sectional views showing a semiconductor device having multiple contact pads according to the present invention, taken along lines I–I' and 2–2' of FIG. 3.
Figure 4A:
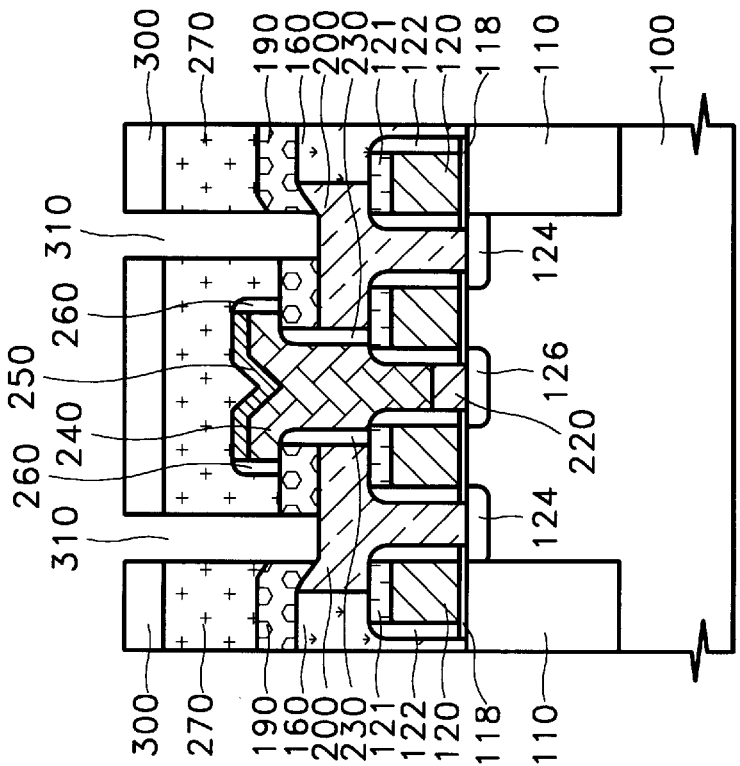

Referring now to FIGS. 4A and 4B, a semiconductor device according to the present invention includes a transistor having first and second conductive regions, e.g., a source 124 and a drain 126, a respective one of which is formed in a semiconductor substrate on an opposite side of a gate electrode 120. A first pad, such as a storage pad 200, is connected to the source 124 and is formed of a first conductive layer. A second capping layer 190 is on the storage pad 200. A second spacer 230 is on the sidewall of the storage pad 200 and on the sidewall or the second capping layer 190. A second pad such as a bit line pad 240, is connected to the drain 126 and is formed of a second conductive layer, one sidewall of which is in contact with the second spacer 230. Reference numerals is FIGS. 4A and 4B which are not described above will be described in connection with the succeeding figures.

Figure 6A:
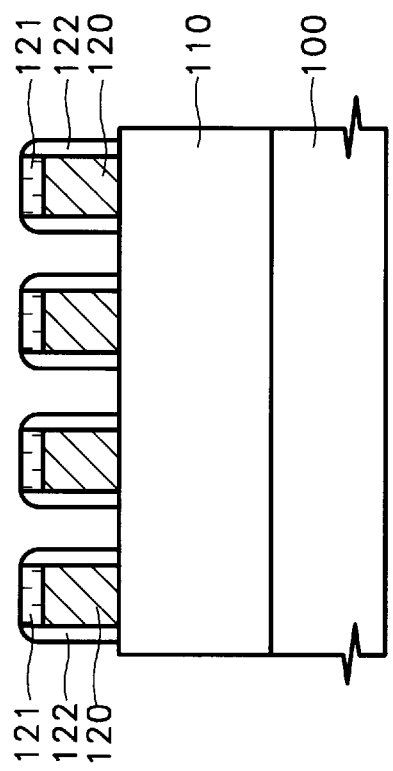
Figure 5A:
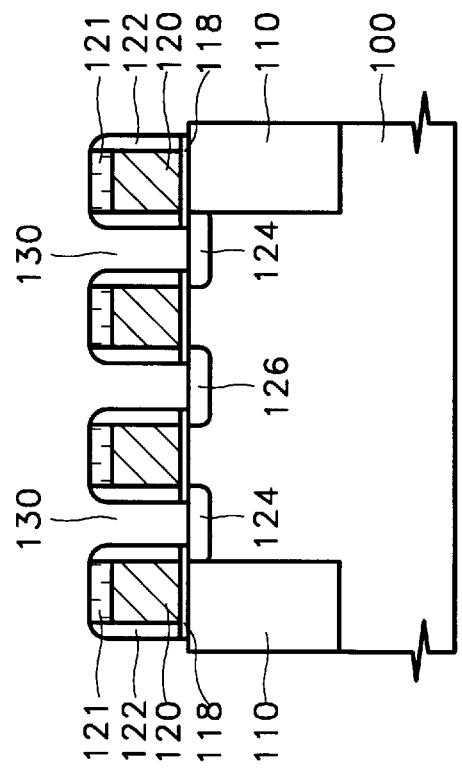

FIGS. 5A through 5L and 6A through 6L are cross-sectional views which sequentially illustrate a semiconductor device having multiple contact pads, taken along lines I–I' and 2–2' of FIG. 3, respectively, according to the present invention, during intermediate fabrication steps. FIGS. 5A and 6A illustrate a method of forming a transistor. The method includes forming an isolation film 110 for isolating devices in an inactive region of a semiconductor substrate 100 using the first mask pattern P11 of FIG. 3. For example, a shallow trench isolation method may be used. A gate oxide film 118, a gate electrode formation layer and a first capping formation layer are sequentially deposited on the entire surface of the semiconductor substrate 100. The deposited gate electrode formation layer and first capping formation layer are then etched, using the second mask pattern P12 of FIG. 3, thereby forming a gate electrode 120 covered with the first capping layer 121.

Insulating material such as silicon nitride ($Si_3N_4$) is deposited on the surface of the substrate where the gate electrode 120 is formed, and is anisotropically etched to form a first insulating spacer 122 on the sidewall of the gate electrode 120 and on the sidewall of the first capping layer 121. Other materials, and multiple layers may also be used. Dopant ions are implanted into the surface of the substrate, thereby forming a source region 124 and a drain region 126 of a transistor.

The isolation film 110 formed by the above-mentioned narrow trench isolation can be also formed by a local oxidation of silicon (LOCOS) or other methods. Also, the first capping layer 121 can be formed of silicon nitride, a high temperature oxide film or other insulators.

During the anisotropic etching which forms the first spacer 122, the gate oxide layer in the regions where the source and drain are to be formed is also removed. This exposes the source 124 and drain 126, and forms a first contact hole 130 and a second contact hole 140, which are self-aligned to the first spacer 122.

Figure 6B:
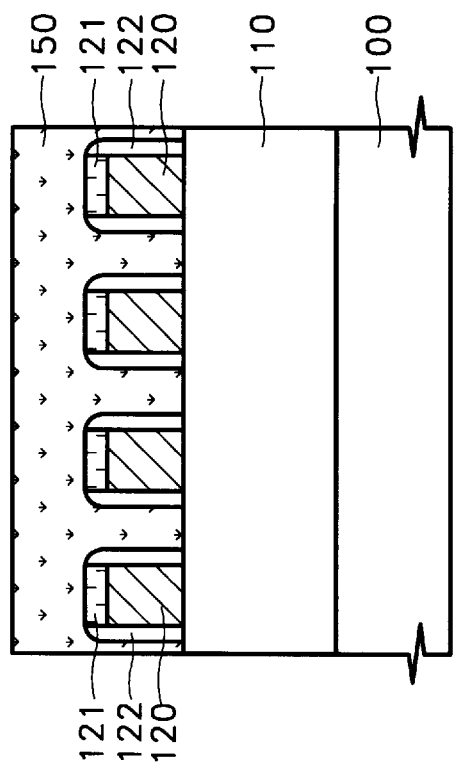
Figure 5B:
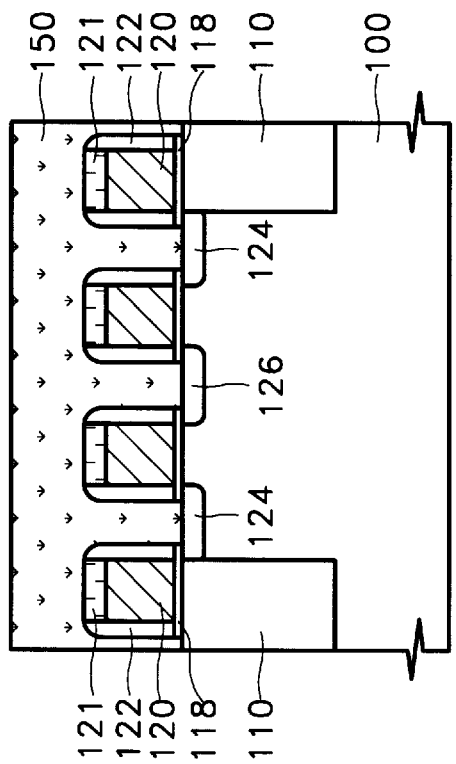

FIGS. 5B and 6B are cross-sectional views showing the semiconductor substrate including a first insulating layer 150. Insulating material such as an oxide, is deposited on the surface of the resultant substrate where a transistor is formed. Layer 150 is sufficiently thick so as not to expose the first capping layer 121. Layer 150 is reflowed to thereby form a first insulating layer 150 with a planarized surface.

Figure 6C:
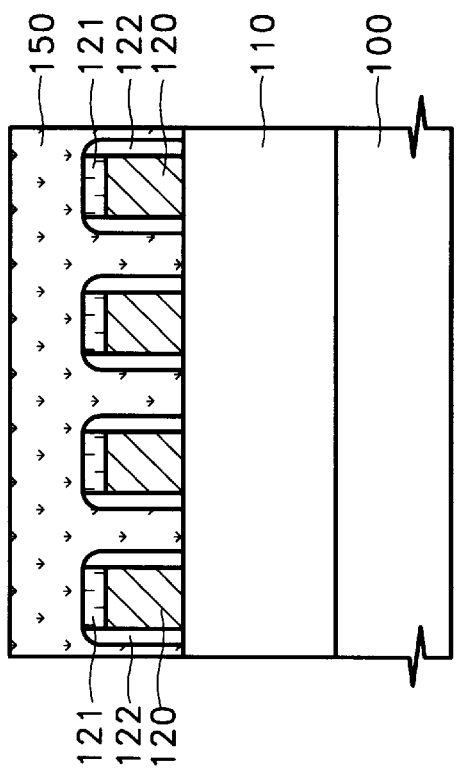
Figure 5C:
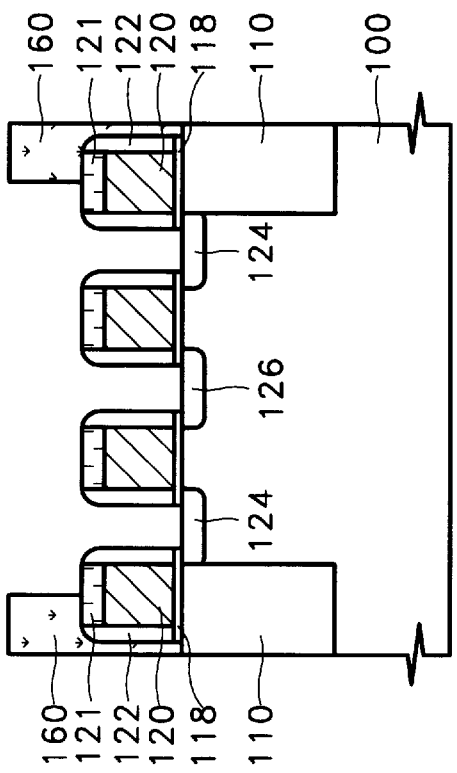

FIGS. 5C and 6C are cross-sectional views showing the semiconductor substrate having a reverse pattern layer 160 thereon. The first insulating layer 150 is partially removed by photolithography using the third mask pattern P13 of FIG. 3, to thereby form a reverse pattern layer 160, which will be used to form a storage pad.

The third mask pattern P13 extends vertically (see FIG. 3) the same distance as the first mask pattern P11, and extends horizontally (see FIG. 3) longer than the first mask pattern P11. Accordingly, the reverse pattern layer 160 is formed such that only an active region is exposed vertically (see FIGS. 5C and 6C) and the active region and a gate electrode formed on an inactive region are exposed horizontally (see FIGS. 5C and 6C).

The reverse pattern layer 160 is planarized, and has uniform thickness due to the reflow described in FIGS. 5B and 6B. Thus, during succeeding steps such as pad formation, process margins need not be reduced due to step differences.

Figure 6D:
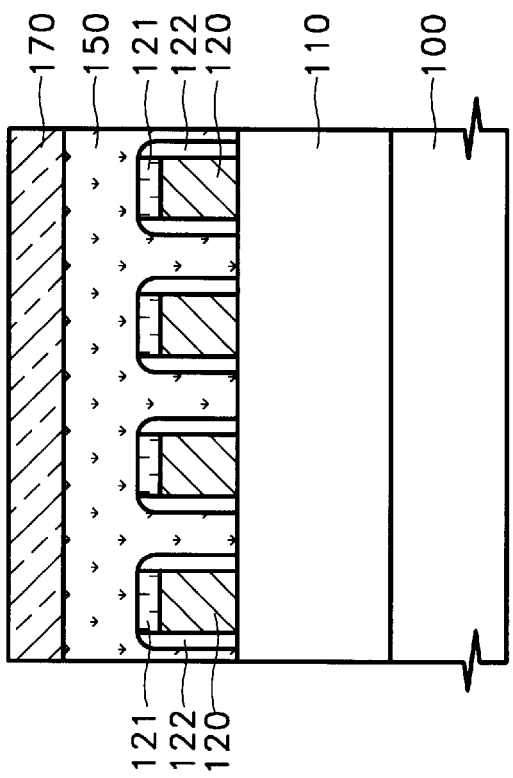
Figure 5D:
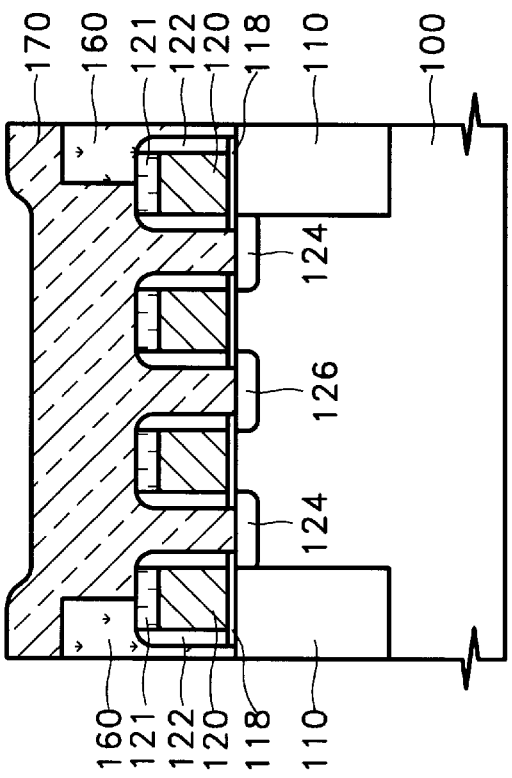

FIGS. 5D and 6D are cross-sectional views showing the semiconductor substrate including a conductive layer 170. Conductive material, such as doped polysilicon is deposited on the surface of the substrate, to thereby form the conductive layer 170. The conductive layer 170 is preferably sufficiently thick to completely cover the surface of the reverse pattern layer 160.

FIGS. 5E and 6E are cross-sectional views showing the semiconductor substrate including a conductive layer pattern 180. The conductive layer 170 (FIGS. 5D and 6D) is etched back to form the conductive layer pattern 180. Conductive layer pattern 180 forms a storage pad on the semiconductor substrate which is exposed by the reverse pattern layer 160. The etch back is preferably continued until the conductive layer pattern 180 is lower than the first reverse pattern layer 160, but is higher than the gate electrode 120. That is, etch back is performed until the conductive layer is eliminated from the top surface of the reverse pattern layer 160. Referring to FIG. 5E, it can be seen that the conductive layer pattern 180 is formed in a reverse pattern of the reverse pattern layer 160.

FIGS. 5F and 6F show a process for forming a storage pad 200 and a second capping layer 190. This process includes the step of coating the surface of the substrate with insulating material, such as high temperature oxide, to thereby form a second capping layer formation layer. The conductive layer pattern and second capping layer formation layer are removed from over the drain 126 by photolithography using the fourth mask pattern P14 of FIG. 3. A third contact hole 210 is thereby formed, which connects a bit line pad (not shown) and the drain region 126. The conductive layer pattern and the second capping layer formation layer remaining on the source 124 form a storage pad 200 and a second capping layer 190, respectively.

The storage pad 200 is connected to the source 124 through the first contact hole 130 of FIGS. 5A and 6A, and is preferably of the size of each source plus its peripheral portion. See the storage pad formation region R11 shown in FIG. 3. During etching, the conductive layer pattern formed on the drain 126 is preferably not completely removed. The remaining conductive pattern forms a remaining layer 220, the height of which is lower than that of the gate electrode 120. Remaining layer 220 prevents the surface of the semiconductor substrate from being damaged by the etching.

FIGS. 5G and 6G show the steps of forming a second spacer 230. The entire surface of the substrate is coated with insulating material such as high temperature oxide, to thereby form a spacer layer. The spacer layer is anisotropically etched, to thereby form a second spacer 230 on the sidewall of a third contact hole 210. The second spacer 230 formed on the sidewall of the storage pad 200, and the second capping layer 190 insulates the storage pad from other conductive layers, such as a bit line pad, which is formed later.

Figure 6H:
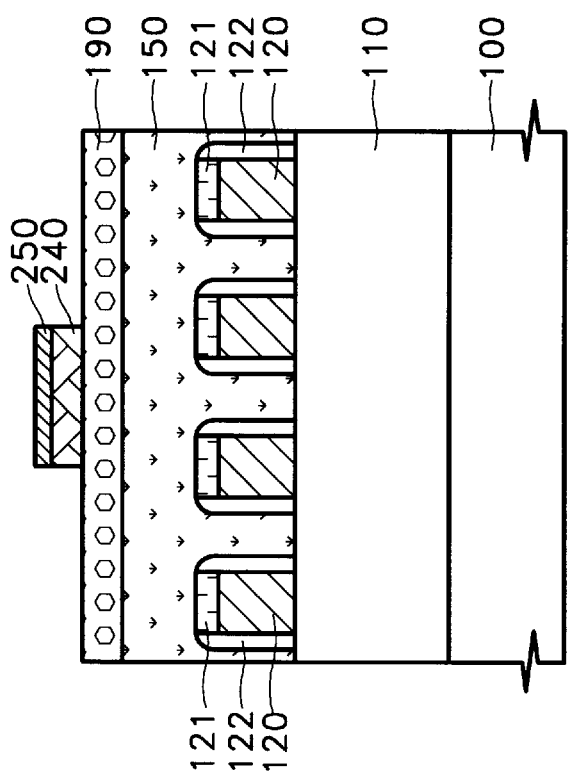
Figure 5H:
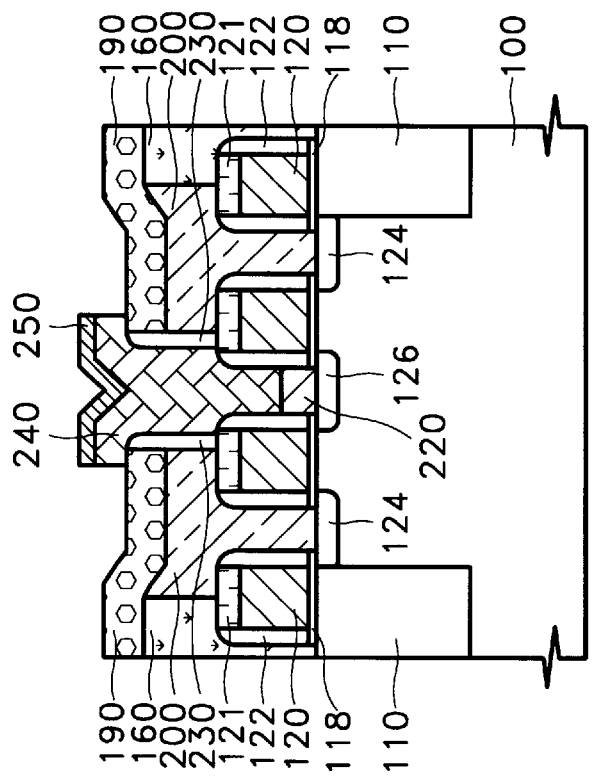

FIGS. 5H and 6H show a method for forming a bit line pad 240 and a third capping layer 250. Conductive material such as doped polysilicon is deposited on the surface of the substrate, to thereby form a bit line pad formation layer. The bit line pad formation layer is coated with insulating material such as high temperature oxide, to thereby form a third capping layer formation layer. The third capping layer formation layer and the bit line pad formation layer are sequentially etched using the fifth mask pattern P15, to thereby form a third capping layer 250 and a bit line pad 240, respectively.

The bit line pad formation layer preferably completely fills the third contact hole 210 of FIGS. 5G and 6G, to thereby connect the bit line pad 240 to the drain 126. The bit line pad 240 is separated from the storage pad 200 by the second spacer 230.

Figure 2A:
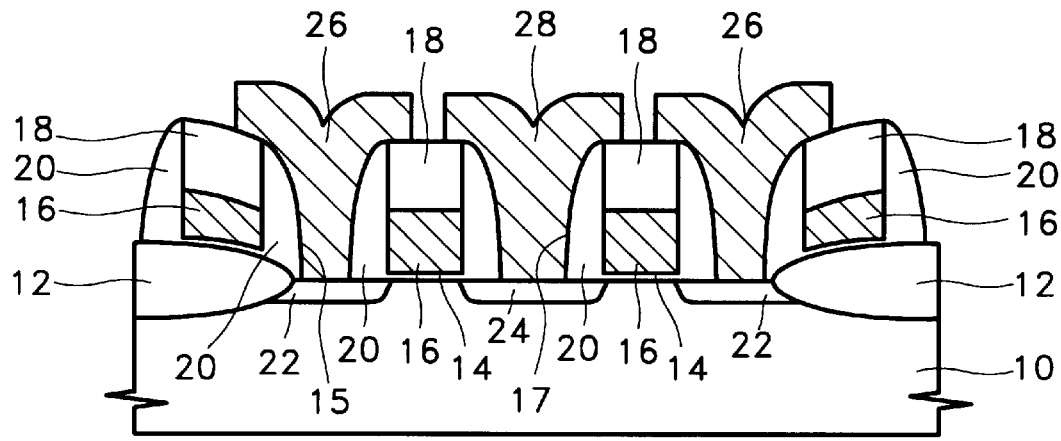
FIGS. 2A and 2B are cross-sectional views which illustrate a conventional semiconductor device having multiple pads, taken along line II–II' of FIG. 1, during intermediate fabrication steps.
Figure 2B:
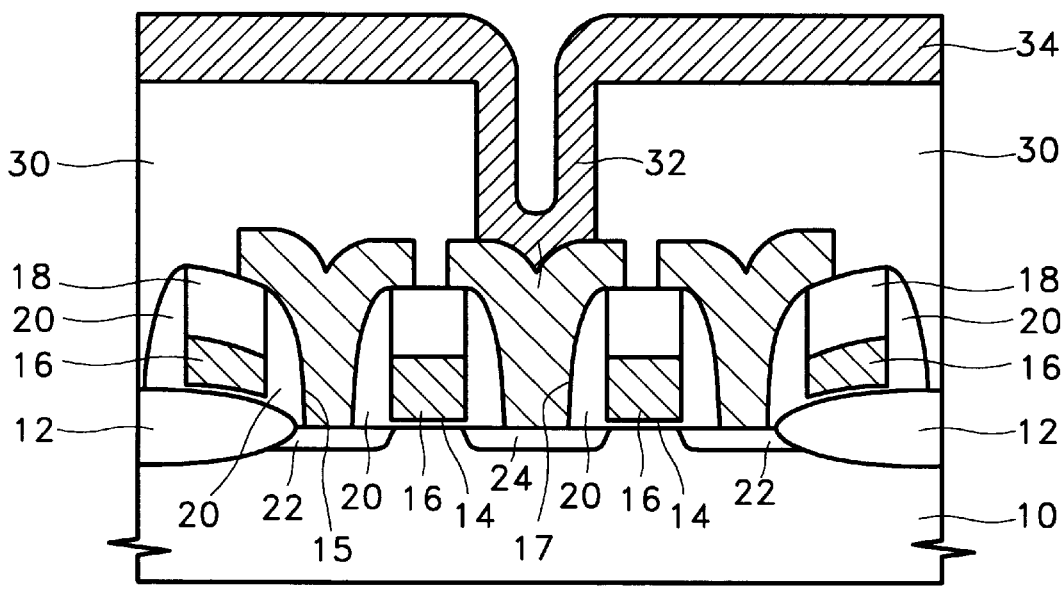

Since the storage pad 26 of FIG. 2A and the bit line pad 28 of FIG. 2A are formed on the same layer in the prior art, the requisite space for isolating the pads from each other and the requisite space which is occupied by the pads generally must be taken into consideration in the cell layout. As integration density increases, isolation and occupation spaces are reduced, which can cause yield and reliability problems.

In contrast, according to the present invention, since the storage pad 200 and the bit line pad 240 are formed of different layers, there is generally no need to simultaneously consider both isolation and occupation spaces for the pads. That is, even though the fifth mask pattern (P15 of FIG. 3) for forming the bit line pad partially overlaps the storage pad formation region R11 in the layout, they do not electrically contact each other in the fabricated cell. Accordingly, the storage pad and the bit line pad can be made larger than those fabricated by the conventional method, and process margins also can be increased in forming the pads. Also, formation of a conductive bridge between the storage pad and the bit line pad can be prevented.

Figure 6I:
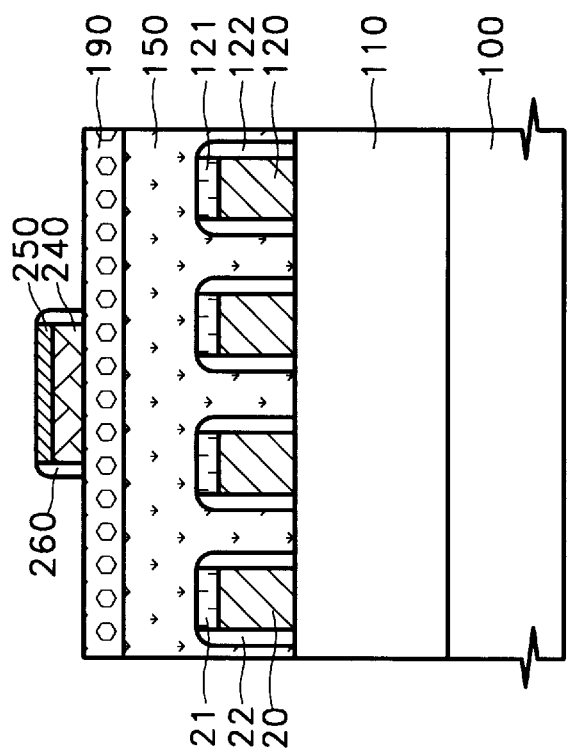
Figure 5I:
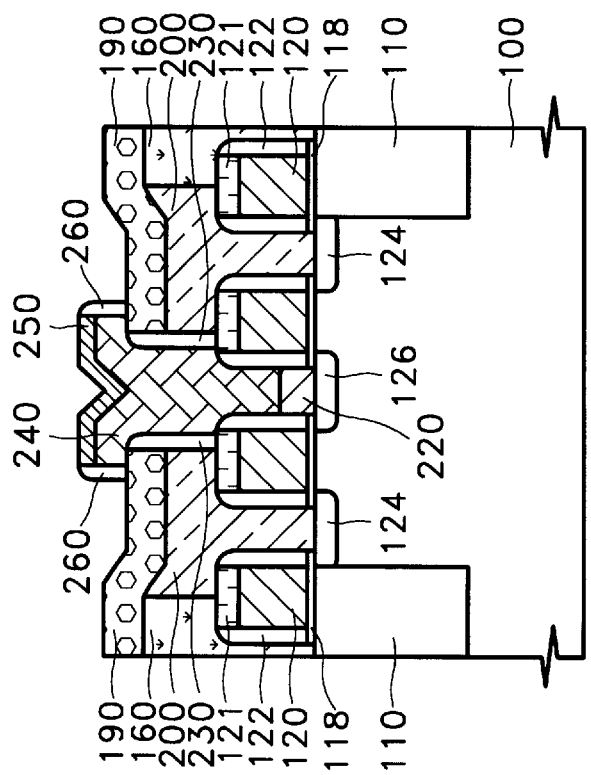

FIGS. 5I and 6I show a method for forming a third spacer 260. Insulating material'such as high temperature oxide is deposited on the surface of the substrate and is anisotropically etched, to thereby form the third spacer 260 on the sidewall of the third capping layer 250 and on top of the bit line pad 240. The third spacer 260 is formed in order to insulate the bit line pad 240 from other conductors such as a storage electrode.

Figure 6J:
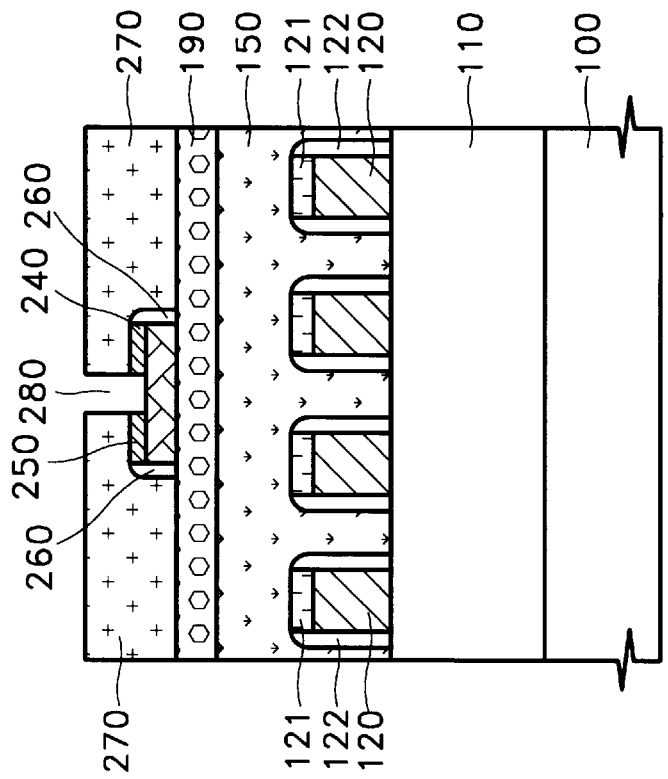
Figure 5J:
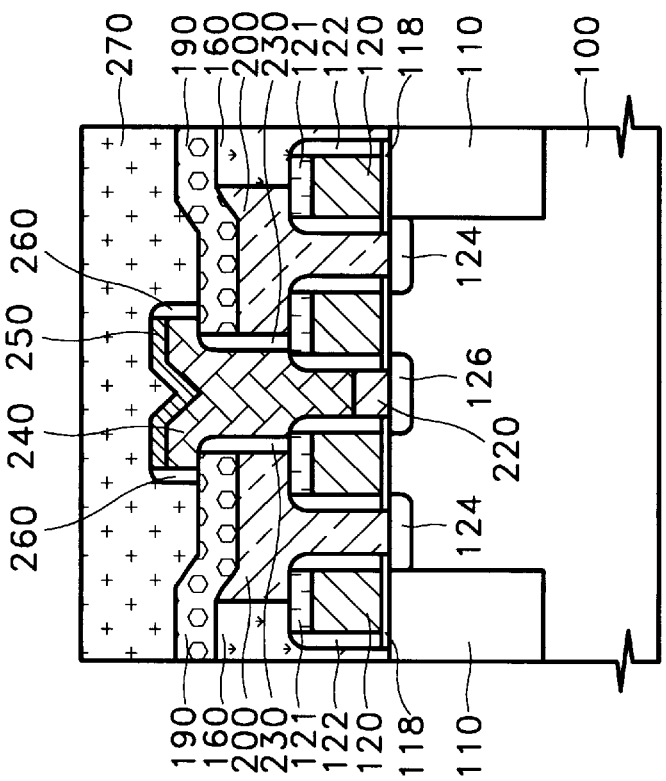

FIGS. 5J and 6J show a method for forming a fourth contact hole 280 such as a bit line contact hole. A second insulating film 270 is formed on the substrate. The third capping layer 250 and the second insulating film 270, which are on the bit line pad 240, are etched, to thereby form the fourth contact hole 280, which connects a bit line (not shown) to the bit line pad 240. The second insulating film is preferably a planarized single layer manufactured by depositing and reflowing boron-phosphorus doped glass, or as a plurality of layers where a pure oxide film is deposited on the surface-planarized BPSG layer, or using other conventional techniques.

Figure 5K:
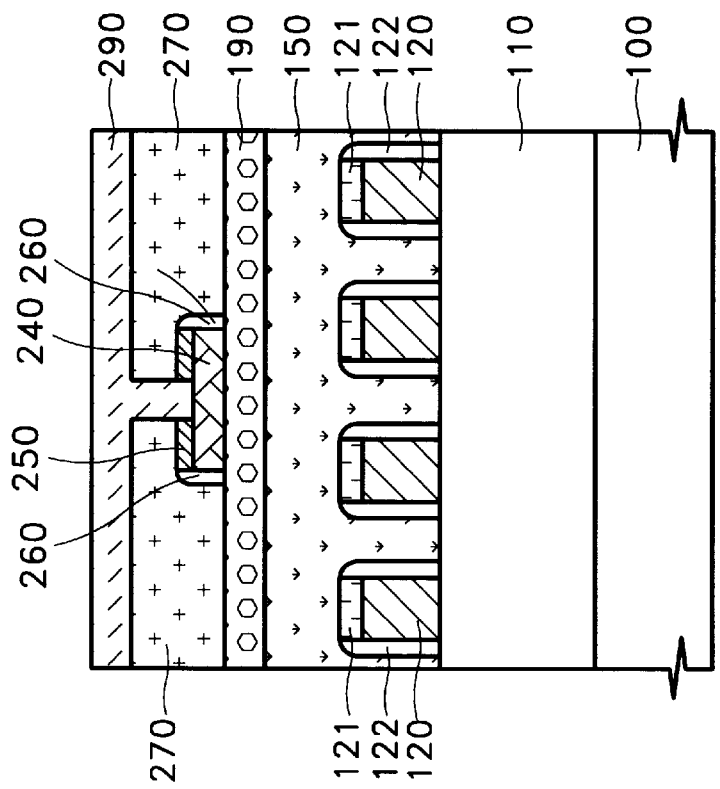
Figure 6K:
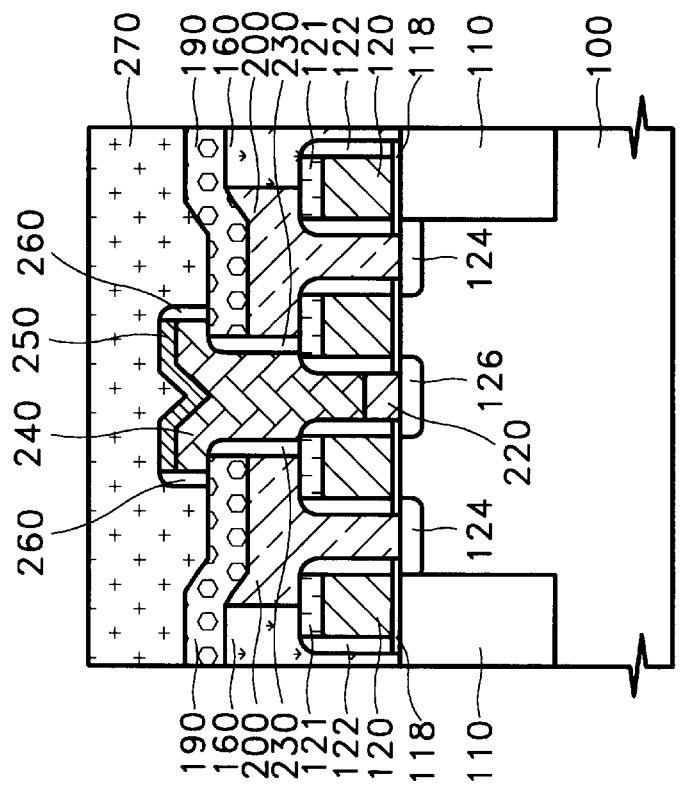

FIGS. 5K and 6K show a method for forming a bit line 290. Doped polysilicon is deposited on the surface of the substrate, to thereby form the bit line 290. The bit line 290 is connected to the drain 126 by the bit line pad 240.

FIGS. 5L and 6L show a method for forming a fifth contact hole 310 such as a storage electrode contact hole. A third insulating film 300 is formed on the substrate. Material layers deposited on the storage pad 200 are removed by lithography, using the seventh mask pattern P17 of FIG. 3, to thereby form a fifth contact hole 310 for connecting a storage electrode (not shown) to the storage electrode pad 200.

A storage electrode, a dielectric film and a plate electrode may then be formed by conventional steps, to thereby complete a memory device through a metal interconnection process.

Referring again to FIG. 3, since sixth mask patterns P16 are offset, the distance L4 therebetween can be larger than when formed by a conventional method. Moreover, since seventh mask patterns P17 are arranged outside the active region, the distance L5 between the sixth mask pattern and the seventh mask pattern also can be made larger than when formed by a conventional method. Accordingly, the reliability of the insulation of the storage electrode contact hole and the bit line contact hole and between the storage electrode contact holes can be enhanced. Processing margins which are greater than those used by a conventional method can be used.

According to the present invention, the storage pad and bit line pad may be made larger than those formed by a conventional method. The process margin in forming the pads may be increased. The process margin in forming a contact hole which connects the pads to other conductive layers such as the storage electrode or bit line, may also be increased. Moreover, the likelihood of forming a conductive bridge between the storage pad and the bit line pad may be reduced. Finally, it is possible to enhance the reliability of the insulation between the storage electrode contact hole and bit line contact hole and between the storage electrode contact holes.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating an integrated circuit field effect transistor, comprising:

forming spaced apart source and drain regions in a semiconductor substrate and a gate electrode on said semiconductor substrate, between said spaced apart source and drain regions, said gate electrode including a gate electrode top, opposite said substrate;

forming a first pad, electrically contacting one of said spaced apart source and drain regions, and extending onto said gate electrode top, to define a first pad sidewall on said gate electrode top, and a capping layer on said first pad, opposite said gate electrode top, to define a capping layer sidewall on said first pad; then forming an insulating sidewall spacer on said first pad sidewall and on said capping layer sidewall; and then forming a second pad, electrically contacting the other of said spaced apart source and drain regions, extending onto said gate electrode top, and contacting said insulating sidewall spacer and insulated from the first pad by said insulating sidewall spacer.

2. A method according to claim 1 wherein said capping layer is a first capping layer, wherein said capping layer sidewall is a first capping layer sidewall, and wherein said second pad extends onto said capping layer to define a second pad sidewall, said method further comprising:

forming a second capping layer on said second pad, opposite said substrate, to define a second capping layer sidewall on said second pad; and forming a second insulating sidewall spacer on said second pad sidewall and on said second capping layer sidewall.

3. A method of fabricating an integrated circuit field effect transistor, comprising:

forming spaced apart source and drain regions in a semiconductor substrate and a gate electrode on said semiconductor substrate, between said spaced apart source and drain regions, said gate electrode including a gate electrode top, opposite said substrate;

forming a first conductive layer on said semiconductor substrate, including on said gate electrode;

forming a capping layer on said first conductive layer;

patterning said capping layer and said first conductive layer to form a first pad, electrically contacting one of said spaced apart source and drain regions, and having said capping layer thereon, said patterning step defining a first pad sidewall and a capping layer sidewall; then forming a sidewall spacer on said first pad sidewall and on said capping layer sidewall; then forming a second conductive layer on said semiconductor substrate, including on said sidewall spacer; and then patterning said second conductive layer to form a second pad, electrically contacting the other of said spaced apart source and drain regions, and insulated from said first pad by said sidewall spacer.

4. A method according to claim 3 wherein said step of forming a first conductive layer on said semiconductor substrate comprises:

forming a planarized insulating layer on said semiconductor substrate, including on said gate;

removing said planarized insulating layer from on said source and drain regions and from on said gate;

forming a first conductive layer on said source and drain regions, on said gate and on said planarized insulating layer; and etching said first conductive layer to expose said planarized insulating layer.

5. A method according to claim 3 wherein said step of forming a second conductive layer on said semiconductor substrate, including on said sidewall spacer is followed by:

forming a second capping layer on said second conductive layer; and wherein said step of patterning said second conductive layer to form a second pad, comprises the step of:

patterning said second capping layer and said second conductive layer to form said second pad, electrically contacting the other of said spaced apart source and drain regions, and insulated from said first pad by said sidewall spacer, and having said second capping layer thereon.

6. A method according to claim 3 wherein said step of patterning said second conductive layer to form a second pad, is followed by:

forming a first interlayer insulating layer on said semiconductor substrate including on said second pad;

etching said first interlayer insulating layer over said second pad, to thereby form a first contact hole to partially expose said second pad; and forming a third conductive layer which electrically connects to said second pad through said first contact hole.

7. A method according to claim 6 wherein said step of forming a third conductive layer which electrically connects to said second pad through said first contact hole, is followed by:

forming a second interlayer insulating layer on said semiconductor substrate including on said third conductive layer; and etching said first and second interlayer insulating layers over said first pad, to thereby form a second contact hole to partially expose said first pad.

8. A method of fabricating an integrated circuit field effect transistor, comprising:

forming spaced apart isolation regions in a semiconductor substrate, spaced apart source and drain regions in said semiconductor substrate between said spaced apart isolation regions, and a gate electrode on said semiconductor substrate, between said spaced apart source and drain regions, said gate electrode including a gate electrode top, opposite said substrate;

forming an insulating film on said spaced apart isolation regions;

forming a first conductive layer on said semiconductor substrate, including on said insulating film;

removing said first conductive layer from said insulating film;

forming a first capping layer on said first conductive layer and on said insulating film;

patterning said first capping layer and said first conductive layer over said drain region to form a first pad, electrically contacting said source region, and having said first capping layer thereon, said patterning step defining a first pad sidewall and a first capping layer sidewall; then forming a first sidewall spacer on said first pad sidewall and said first capping layer sidewall; then forming a second conductive layer on said semiconductor substrate, including on said first sidewall spacer; then forming a second capping layer on said second conductive layer; then patterning said second conductive layer and said second capping layer to form a second pad, electrically contacting said drain region, and insulated from said first pad by said first sidewall spacer, said patterning step defining a second pad sidewall and a second capping layer sidewall; and then forming a second sidewall spacer on said second pad sidewall and on said second capping layer sidewall.

9. A method according to claim 8 wherein said step of patterning said second conductive layer to form a second pad, is followed by:

forming a first interlayer insulating layer on said first capping layer and on said second pad;

etching said first interlayer insulating layer over said second pad, to thereby form a first contact hole to partially expose said second pad;

forming a third conductive layer which electrically connects to said second pad through said first contact hole; and patterning said third conductive layer to thereby form a bit line which is connected to said second pad through said first contact hole.

10. A method according to claim 9 wherein said step of patterning said third conductive layer is followed by:

forming a second interlayer insulating layer on said semiconductor substrate including said bit line;

etching said first and second interlayer insulating layers over said first pad, to thereby form a second contact hole to partially expose said first pad; and forming a storage electrode of a capacitor on said second interlayer insulating layer, which electrically contacts said first pad through said second contact hole.

* * * * *